United States Patent [19]
Bates

[11] 3,965,370
[45] June 22, 1976

[54] PULSE REGENERATING CIRCUIT
[75] Inventor: Wayne J. Bates, Des Plaines, Ill.
[73] Assignee: Motorola, Inc., Schaumburg, Ill.
[22] Filed: Dec. 20, 1974
[21] Appl. No.: 535,006

[52] U.S. Cl. .............................. 307/268; 307/235 J; 307/261; 328/164
[51] Int. Cl.² ...................... H03K 5/01; H03K 6/06
[58] Field of Search ................ 307/261, 268, 235 J; 328/164

[56] References Cited
UNITED STATES PATENTS
3,226,575  12/1965  Whittle .............................. 307/268
3,302,034  1/1967  Nowell .............................. 307/261
3,374,366  3/1968  Kleinberg ........................... 307/268

*Primary Examiner*—Stanley D. Miller, Jr.
*Attorney, Agent, or Firm*—Vincent J. Rauner; Eugene A. Parsons

[57] ABSTRACT

A transistor switch having a square pulse with distorted leading and lagging edges and a distorted amplitude applied to the base thereof and the same pulse applied through two semiconductor junctions and a voltage divider to provide a voltage equal to the voltage applied to the base divided by one half with the voltage across a semiconductor junction subtracted therefrom and trigger the switch at one half the amplitude of the pulses applied thereto.

7 Claims, 2 Drawing Figures

PULSE REGENERATING CIRCUIT

BACKGROUND OF THE INVENTION

In many applications wherein square waves are utilized for signaling or operating subsequent equipment, it is imperative that the square waves have the correct duty cycle, or on to off time. If the square waves are transmitted or passed through filters for any reason, they are generally badly distorted because many of the upper harmonics are removed or attenuated and delayed by the transmission or filtering. Generally, the removal or attenuation and delay of the upper harmonics will round the square waves and cause the leading and lagging edges thereof to have a much greater slope. Further, during transmissions the amplitude of the square wave may vary due to changes in conditions, fading, etc., whereby subsequent equipment utilizing the square waves will not be able to determine the correct duty cycle of the square waves.

Peak detectors and the like, which are utilized in the prior art, are unsatisfactory because variations in both the amplitude and the slope of the sides causes the peak detector to provide erroneous outputs. With the amplitude of the pulses and the leading and lagging edges being distorted most prior art equipment cannot duplicate the duty cycle of the original square waves without a large and complicated amount of special equipment.

SUMMARY OF THE INVENTION

The present invention pertains to a pulse regenerating circuit including a transistor switch having the distorted pulses applied to the base thereof with the emitter biased to one half of the peak voltage minus the voltage drop between the base and emitter so that the switch operates at approximately one half of the peak voltage of the input pulses. Thus, the duty cycle of the regenerated pulses is independent of input pulse amplitude (above a predetermined minimum) or waveform distortion. Because the reference voltage at which the transistor switch operates varies with the amplitude of the input pulses, rather than operating at some nominal amplitude, the duty cycle of the input pulses can be accurately regenerated in spite of the changing amplitude and sloping sides.

It is an object of the present invention to provide a self-compensating pulse regenerating circuit.

It is a further object of the present invention to provide a pulse regenerating circuit including a transistor switch which operates at approximately one half of the amplitude of the input pulses to provide an output square wave having a duty cycle approximately equal to the original, undistorted input pulses.

These and other objects of this invention will become apparent to those skilled in the art upon consideration of the accompanying specification, claims and drawings.

BRIEF DESCRIPTION OF THE DRAWINGS

Referring to the drawings.

DESCRIPTION OF THE PREFERRED EMBODIMENT

Figure 1:
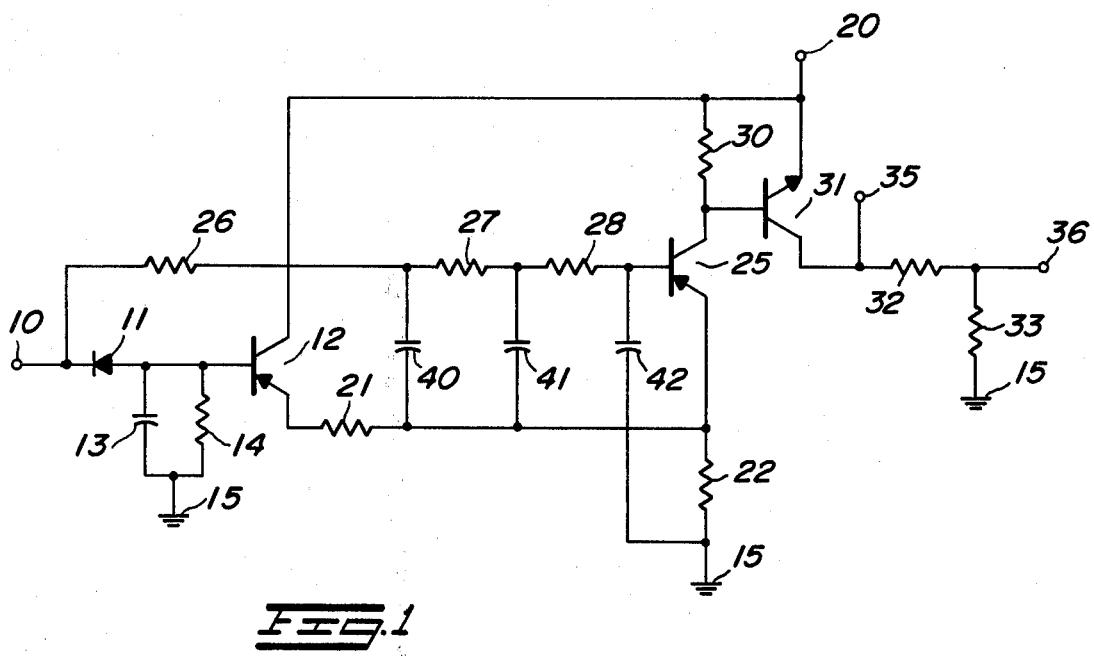
FIG. 1 is a schematic diagram of an embodiment of the novel pulse regenerating circuit.
Figure 2:
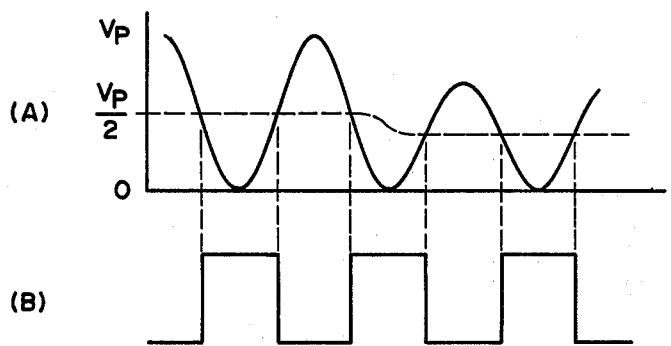
FIG. 2 illustrates input and output waveforms for the circuit shown in FIG. 1.

Referring to the Figures, the numeral 10 designates an input terminal adapted to receive distorted input pulses, which may appear for example somewhat as depicted in FIG. 2, waveform A. The terminal 10 is connected to the cathode of a semiconductor diode 11, the anode of which is connected to the base of a p-n-p type transistor 12. A capacitor 13 and resistor 14 are connected in parallel from the base of the transistor 12 to a ground or common 15. The collector of the transistor 12 is connected directly to a terminal 20 adapted to have a suitable source of power (in this case a negative voltage) connected thereto. The emitter of the transistor 12 is connected through a pair of series connected, approximately equal resistors 21 and 22 to ground 15. The resistors 21 and 22 form a voltage divider having an output terminal at the junction thereof, which output terminal is connected to the emitter of a p-n-p type transistor 25, which forms a transistor switch.

The input terminal 10 is also connected through three substantially equal resistors 26, 27 and 28, connected in series, to the base of the transistor 25. The collector of the transistor 25 is connected through a resistor 30 to the terminal 20 and also, directly to the base of an n-p-n type transistor 31. The transistor 31 forms an inverter, which is not essential to the present invention, but which provides an output pulse that is ready for use in equipment requiring negative voltages, such as depicted in this embodiment. The emitter of the transistor 31 is connected directly to the terminal 20 and the collector is connected through a pair of series connected resistors 32 and 33 to ground 15. An output is available directly at the collector of the transistor 31, depicted by an output terminal 35, and/or an output is available at the junction of the resistors 32 and 33, depicted by an output terminal 36. The output waveform at either of the terminals 35 or 36 will appear as the inverse of the waveform B in FIG. 2 and will vary in amplitude according to the relative values of the resistors 32 and 33.

A capacitor 40 is connected to the junction between the resistors 26 and 27 and to the emitter of the transistor 25. A second capacitor 41, which is similar in size to the capacitor 40, is connected to the junction between the resistors 27 and 28 and to the emitter of the transistor 25. A third capacitor 42, smaller in size than the capacitors 40 and 41, is connected to the base of the transistor 25 and to ground 15. The resistors 26, 27 and 28 and the capacitors 40, 41 and 42 form a lowpass active filter in conjunction with the transistor 25 which aids in removing any high frequency interference that may be present with the input pulses at the terminal 10. This low pass active filter is not necessary to the present invention but may improve the operation thereof where interference is present that cannot adequately be removed prior to the terminal 10.

The diode 11 is formed of material similar to that of transistor 25, for example silicon, so that the voltage drop across the diode 11 is approximately equal to the voltage drop between the base and emitter of the transistor 25. Further, the transistor 12 is selected so that the voltage drop between the base and emitter thereof is approximately equal to the voltage drop between the base and emitter of the transistor 25. Generally, if the diode 11 and transistors 12 and 25 are silicon, the voltage drops described will be approximately 0.7 volts.

The waveform available at the base of the switching transistor 25 is approximately equal to the input waveform applied to the input terminal 10, the peak voltage of which will be referred to as $V_p$, or the peak voltage of the input waveform. The capacitor 13 and resistor 14 form a filter which, in conjunction with the rectifying action of the diode 11, provide a rectified DC voltage at the base of the transistor 12. Since the waveform having a peak voltage, $V_p$, is available at the input terminal 10, the DC voltage available at the base of the transistor 12 is $V_p$ minus the voltage drop across the diode 11. Further, the voltage available at the emitter of the transistor 12 is $V_p$ minus the voltage drop across the diode 11 and the voltage drop across the base to emitter junction of the transistor 12. Since the resistors 21 and 22 are approximately equal, the voltage available at the junction therebetween will be approximately one half of the voltage available at the emitter of the transistor 12, or $V_p/2$ minus the voltage drop across the diode 11 (since the voltage drop across the diode 11 and the voltage drop across the base to emitter junction of the transistor 12 are equal). Thus, the voltage applied to the emitter of the transistor 25 is approximately equal to one half of the voltage applied to the base thereof minus the voltage drop across the base to emitter junction thereof.

In the operation of the transistor switch 25, the emitter will always be biased at approximately one half of the voltage applied to the base minus the voltage drop across the base to emitter junction thereof so that the transistor switch 25 will always be triggered at approximately one half of the amplitude of the input wave applied to the input terminal 10. Referring to waveform A of FIG. 2, the dotted line designated $V_P/2$ indicates the point on each waveform where the transistor switch 25 will be triggered. It should be noted that amplitude variations in the input wave produce a variation in the point at which the transistor switch 25 will be triggered. It should further be noted that if the transistor switch 25 were triggered at the same value throughout the input waveform, as generally performed in the prior art, the width of the third output pulse in the waveform B of FIG. 2 would be substantially increased. In a like manner, if the amplitude of the input waveform were substantially increased the triggering of the transistor switch 25 at a fixed point would cause the output pulses to be substantially decreased in duration. However, because of the self-compensating feature in the described circuit the output waveform from the transistor switch 25, illustrated as waveform B in FIG. 2, includes pulses having a duty cycle substantially equal to the duty cycle of the original square wave before they were distorted into the input waveform illustrated in waveform A of FIG. 2. While the dotted line $V_P/2$ has been illustrated as changing amplitude virtually instantaneously, for purposes of this description, it should be understood that changes in level of the voltage would actually require several cycles because of the filtering action of capacitor 13 and resistor 14. This, however, will not change the operation of the circuit as described.

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

I claim:
1. A pulse regenerating circuit comprising:
   a. a transistor switch having first, second and control electrodes with means for connecting suitable operating power to the first and second electrodes;
   b. an input terminal adapted to receive pulses having distorted leading and lagging edges and distorted amplitudes;
   c. connecting means coupling said input terminal to the control electrode of said transistor switch;
   d. first and second semiconductor junctions each providing essentially the same voltage drop thereacross as the voltage drop between the first and control electrodes of said transistor switch; and
   e. a voltage divider connected in series with said first and second semiconductor junctions and the series circuit coupled between said input terminal and a reference point, said voltage divider having an output terminal coupled to the first electrode of said transistor switch and providing a voltage thereto approximately one half the voltage applied to said input terminal minus the voltage drop across one of said semiconductor junctions.

2. A pulse regenerating circuit as claimed in claim 1 wherein the first semiconductor junction is a diode formed of the same material as the transistor switch.

3. A pulse regenerating circuit as claimed in claim 2 wherein the second semiconductor junction is a transistor having first, second and control terminals and the diode is coupled between the control terminal of said transistor and the input terminal, the voltage divider is connected between the first terminal of said transistor and a terminal of the suitable operating power with the second terminal of said transistor coupled to a second terminal of the suitable operating power.

4. A pulse regenerating circuit as claimed in claim 3 wherein the transistor switch and the transistor are p-n-p transistors.

5. A pulse regenerating circuit as claimed in claim 1 wherein a filter is connected between the input terminal and the control electrode of the transistor switch.

6. A pulse regenerating circuit comprising:
   a. a transistor switch having first, second and control electrodes with the second electrode being coupled to a suitable source of voltage;
   b. an input terminal adapted to receive pulses having distorted leading and lagging edges and distorted amplitudes;
   c. connecting means coupling said input terminal to the control electrode of said transistor switch;
   d. a semiconductor diode having first and second electrodes with the voltage drop therebetween being substantially equal to the voltage drop between the first and control electrodes of said transistor switch, the first electrode of said diode being connected to said input terminal;
   e. a transistor having first, second and control electrodes with the voltage drop between the first and control electrodes being substantially equal to the voltage drop between the first and control electrodes of said transistor switch, the control electrode of said transistor being connected to the second electrode of said diode and the second electrode of said transistor being coupled to a suitable source of voltage; and f. a voltage divider connected between the first terminal of said transistor and a common terminal, said voltage divider having an output terminal connected to the first electrode of said transistor switch and supplying a voltage thereto approximately one half the voltage applied to said input terminal minus the voltage drop across said diode.

7. A pulse regenerating circuit as claimed in claim 6 wherein the voltage divider includes a pair of substantially equal resistors connected in series with the junction thereof forming the output terminal.

* * * * *